United States Patent [19]

Kimura

[11] 4,076,572

[45] Feb. 28, 1978

[54] CRYSTAL GROWTH AND ANNEAL OF LEAD TIN TELLURIDE BY RECRYSTALLIZATION FROM A HETEROGENEOUS SYSTEM

[75] Inventor: Hiroshi Kimura, Los Angeles, Calif.

[73] Assignee: Hughes Aircraft Company, Culver City, Calif.

[21] Appl. No.: 656,548

[22] Filed: Feb. 9, 1976

Related U.S. Application Data

[63] Continuation of Ser. No. 376,869, July 5, 1973, abandoned, which is a continuation of Ser. No. 176,157, Aug. 30, 1971, abandoned.

[51] Int. Cl.$^2$ ............... B01J 17/02; C01G 21/00; C01B 19/00
[52] U.S. Cl. .................. 156/603; 156/624; 156/605; 156/DIG. 72; 156/DIG. 85; 156/DIG. 73; 148/133; 252/62.3 V; 423/508
[58] Field of Search ............ 156/600, 603, 624, 605, 156/606, DIG. 72, DIG. 73, DIG. 85; 23/305; 148/13, 133, 1.5; 423/89, 111, 115, 123, 508; 252/62, 3 V; 75/166

[56] References Cited

U.S. PATENT DOCUMENTS

| | | | |
|---|---|---|---|
| 3,622,399 | 11/1971 | Johnson | 156/DIG. 72 |
| 3,622,405 | 11/1971 | Schmidt | 156/DIG. 72 |
| 3,748,593 | 7/1973 | Dimmock | 156/DIG. 85 |

OTHER PUBLICATIONS

Calawa, Trans. of the Metal. Soc. of AIME, vol. 242, Mar. 1968, pp. 374-383.
Butler et al., Chem. Abstr., vol. 71, 1969, col. 26495 (269491b).

*Primary Examiner*—Stephen J. Emery
*Attorney, Agent, or Firm*—Lewis B. Sternfels; W. H. MacAllister

[57] ABSTRACT

Large bulk single crystals of lead tin telluride are synthesized by first mixing desired amounts of lead, tin and tellurium with, if desired, bismuth and reacting the mixture at 950° C to form a source material. The source material is then converted into a single crystal by recrystallization and digestion in a uniform 850° C to 860° C temperature zone in order to prevent transport of material and, hence, variations in composition. Thereafter, these crystals, which are doped with bismuth, or crystals made by Bridgman or Czochralski growth, are cut into wafers and isothermally annealed at 600° C to 650° C under a metal-rich vapor pressure obtained from metal-rich lead tin telluride powder. Lowering of temperature to about 200° C and further annealing is capable of converting p-type crystals to n-type crystals. The result of annealing, whether p-type, n-type, or intrinsic, is a low carrier concentration, high mobility crystal.

9 Claims, 12 Drawing Figures

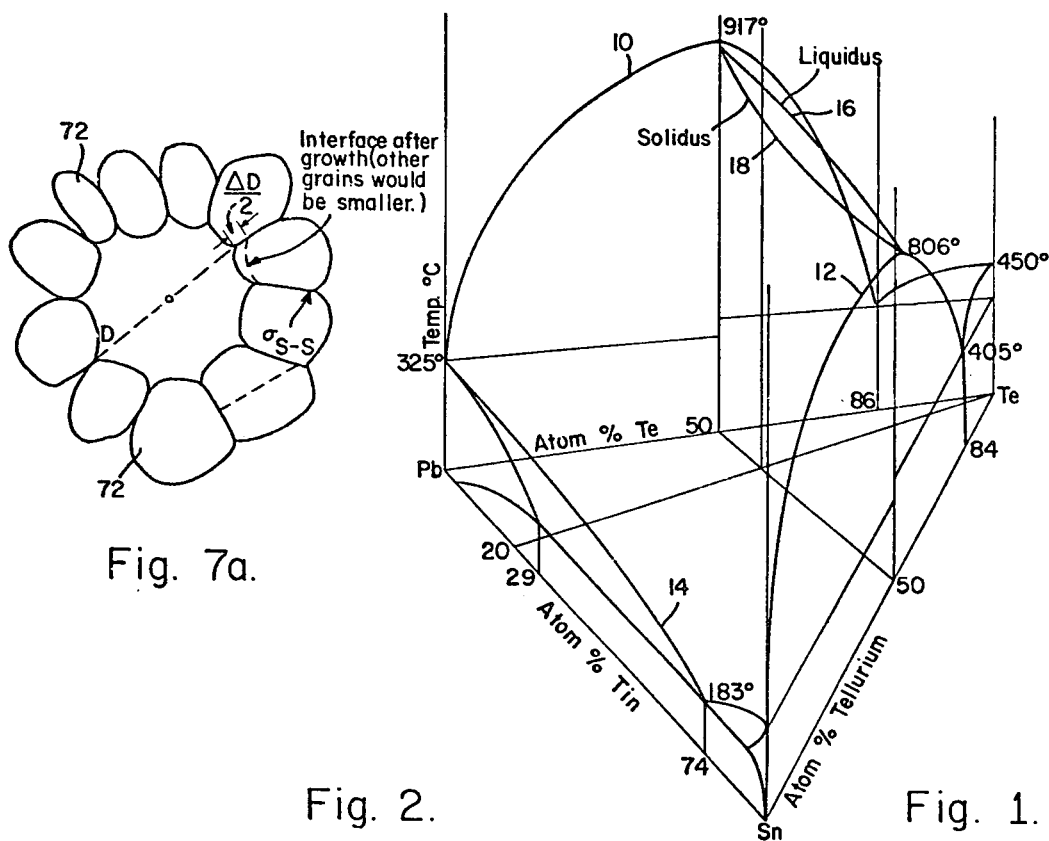
Fig. 7a.
Fig. 1.
Fig. 2.
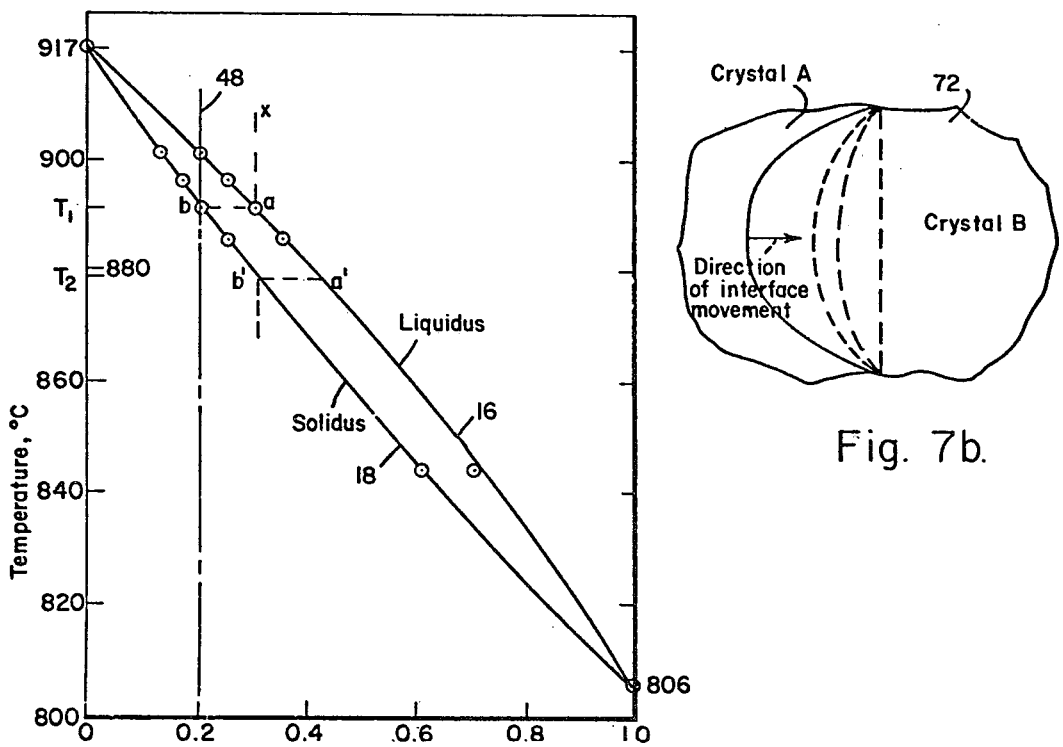
Fig. 7b.

CRYSTAL GROWTH AND ANNEAL OF LEAD TIN TELLURIDE BY RECRYSTALLIZATION FROM A HETEROGENEOUS SYSTEM

BACKGROUND OF THE INVENTION

This is a continuation of application Ser. No. 376,869 filed July 5, 1973, now abandoned in turn a continuation of application Ser. No. 176,157 filed Aug. 30, 1971, now abandoned.

FIELD OF THE INVENTION

The present invention relates to methods for synthesizing and annealing large bulk lead tin telluride single crystals.

DESCRIPTION OF THE PRIOR ART AND BACKGROUND

Lead tin telluride ($Pb_{1-x}Sn_xTe$) is a pseudo-binary system of lead telluride and tin-telluride which forms a solid solution over the entire compositional range wherein $0 \leq x \leq 1$. The two compounds, lead telluride and tin telluride, are mutually soluble in all proportions and the alloy has an energy gap which varies linearly with composition passing through zero and rising again with increasing tin telluride concentration. This energy gap variability, provided by adjustment of the lead to tin ratio, enables use of this composition for intense radiation sources and intrinsic photodetectors covering the wavelength region from about 5 mm. to the far infrared, for injection laser action to about 28 mm., and for photovolatic detection to 30 mm. in lead tin telluride diodes. As a consequence, lead tin telluride has wide use such as radiation detectors, e.g., in the infrared, laser materials, photosensitive devices, and, in general, semiconductor material.

The phase diagram of lead tin telluride (FIGS. 1 and 2) indicates a narrow separation of the liquidus and solidus curves, thereby enabling the advantageous use of several prior art crystal growth methods. Such methods include the Bridgman-Stockbarger, Czochralski, vapor transport, and vapor phase epitaxial growth techniques. All these methods have been relatively successful in producing lead tin telluride; however, they are deficient in one or more respects.

In the Bridgman-Stockbarger and Czochralski methods, growth proceeds from a melt to a solid. Because the liquidus-solidus curves for lead tin telluride are narrowly separated, the composition of a growing crystal differs from that of the melt from which it grows. Therefore, the resulting crystal does not have a uniform composition but varies, as will be more fully explained with reference to FIGS. 1 and 2.

A further problem arising in the Bridgman-Stockbarger and Czochralski techniques resides in maintaining the proper stoichiometry of the lead and tin metal to tellurium. Because lead tin telluride is stable within a relatively wide solidus field, the ratio of metal to tellurium invariably is not equal to one, but is a number greater or less than one, that is, it can exist having a non-stoichiometric composition. As a consequence, the resulting composition is either metal rich or, most usually, metal poor. Thus, the composition is most often nonstoichiometric.

These prior art techniques further give rise to defects and inhomogeneity as a result of constitutional supercooling. Lead tin telluride exhibits a liquid phase which is increasingly enriched in metal as the liquid phase approaches the liquid-solid interface and further exhibits a sudden drop in metal as the solid phase is entered at the liquid-solid interface. Furthermore, metal-rich portions solidify at a temperature lower than that of tellurium-rich portions. Thus, as the solid forms at the liquid-solid interface, because of the variation in composition between the liquid and solid phases and because of faster solidification of metal-rich portions than tellurium-rich portions due to their lower melting point, the resulting crystal shows metal precipitation and an undesired cellular substructure.

Other problems arise because these techniques require operation at high temperature in order to obtain the melt. Such high temperatures promote a greater likelihood that impurities will be leached, in particular from the crucible, especially in view of the large contact area between the crucible and the crystal. In addition, these methods require relatively elaborate and expensive equipment.

In the vapor transport method, the source, having the desired composition, is place in a temperature gradient for sublimation and condensation on a colder surface. Because growth is initiated by spontaneous nucleation, success depends on the ability to obtain the smallest number of nucleation sites, the control of which is very difficult. Thus, this method usually results in the formation of many small points of nucleation at the tip of the tube and their eventual growth together to produce a crystal which is not a single crystal. Furthermore, these crystals are of a very small size, being limited to a few cubic millimeters, and normally contain a high density of voids or minute holes.

Anneal of lead tin telluride is required to reduce high carrier concentration in the as-grown material. One method includes isothermal metal saturated annealing. The undoped as-grown crystal is sliced into thin wafers and the wafers are isothermally annealed with a metal-rich powder. Due to the slow diffusion rate arising from the low cross-over temperature, the temperature at which the stochiometric line crosses the solidus line, the wafers must be annealed for a long time in the order of two months. Another method is to diffuse lead or other doner impurities into the crystal. The disadvantage with this method, also, is the time factor; it requires approximately two weeks to attain a low carrier concentration.

SUMMARY OF THE INVENTION

The present invention overcomes these and other problems by recognizing that compositional deviation and supercooling problems are avoided by growing a crystal at a constant, low temperature in an environment which minimizes contact between the forming single crystals and the crystal growth tube. Constitutional supercooling is absent since the growth is under near-equilibrium conditions. Briefly, the present invention enables large crystals of lead tin telluride be grown from stoichiometric and non-stoichiometric sources. Lead, tin and tellurium are weighed and placed in a crucible which is thereafter evacuated and sealed. The materials are then reacted for a time and at a temperature sufficient to fully combine the ingredients. The reacted material is then broken into pieces which are used as a source material for the crystal forming step. One or more of these pieces is placed in a fused silica cup which is supported within an evacuated and sealed ampoule. The ampoule is placed in a furnace within a uniform temperature zone to prevent transport of material from the cup. The temperature is raised to a point which is slightly above the solidus curve for the particular lead-tin ration. Thus, the operating point on the temperature-composition phase diagram is chosen to provide a minute fraction of the liquid phase so that, in accordance with the lever rule, the solid is equilibrated with the melt which serves as a vehicle for diffusion and crystal growth by digestion. The small surface of contact with the cup and the relatively low growth temperature, as compared to prior art melt techniques, avoids the problem of leaching and facilitates extraction of the crystal product.

At the initial stage of the growth, densification and minimization of surface area takes place by the disappearance of sharp edges and the transformation of the source material into a dome shaped mass which is flat at its bottom, in contact with the cup. Thereafter, facets appear on the top and at the sides while the bottom remains unfaceted. In the case of the crystals grown from a metal-rich source, the metal-rich amorphous phase drains to the bottom of the cup at the completion of the growth. In the case of growth from a stoichiometric source, normally the bottom remains amorphous or full of grain boundaries.

The crystal obtained at this point has an undesired large carrier concentration; therefore, the crystals are annealed by an isothermal annealing technique. Crystals grown as above or by a prior art method and doped with bismuth, are cut into wafers which are chemically etched and placed into a diffusion ampoule with a metal-rich powder of lead tin telluride. The ampoule is evacuated and backfilled with an inert gas and placed into the annealing furnace. Isothermal annealing proceeds at 600°–660° C, depending upon the mole fraction of tin of the crystal, for 5 days and quenched to ambient temperature in air. Many crystals grown in such a manner resulted in a p-type material; however, by lowering the temperature of the furnace to 200° C after the above annealing step, or after quenching and reheating to 200° C, and further annealing for approximately two hours, the crystals changed from p-type to n-type.

It is, therefore, an object of the present invention to provide a method for synthesizing large single crystals of lead tin telluride.

Another object is the provision of such a method for minimizing the compositional variations in the growth of such a crystal.

Another object is to provide a method for growing such crystals with negligible impurity pickup.

Another object is the provision of a simple method requiring minimum attention during growth of such crystals.

Another object is to provide a method for growth of crystals having high crystalline quality and being essentially free of voids.

Another object is to provide a method for annealing single crystals of lead tin telluride.

Another object is the provision of a method for changing the conductivity type of lead tin telluride crystals by annealing.

Another object is to provide a method of lowering the carrier concentration of such crystals by annealing.

Other aims and objects, as well as a more complete understanding of the present invention, will appear from the following explanation of exemplary embodiments and the accompanying drawings thereof.

BRIEF DESCRIPTION OF THE DRAWINGS

FIG. 1 is a three-dimensional phase diagram for lead tin telluride;

FIG. 2 is a phase diagram for lead tin telluride for 50 mole percent tellurium, as shown in FIG. 1;

FIG. 7a and 7b provide illustrations accompanying a theoretical explanation for growth by digestion of the single crystal;

DESCRIPTION OF THE PREFERRED EMBODIMENTS

Figure 3:
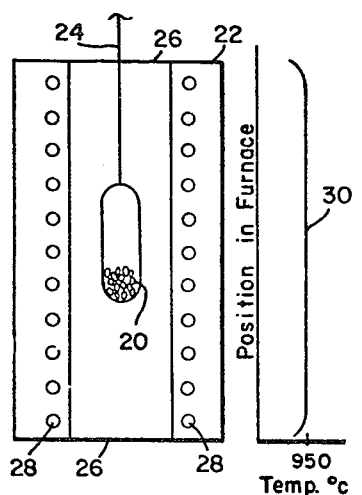
FIG. 3 schematically represents a furnace and a temperature curve for providing the source material.

Accordingly, lead tin telluride is a pseudo-binary system of lead telluride and tin telluride which forms a solid solution of the type $Pb_{1-x}Sn_xTe$ where $0 \leq x \leq 1$ whose band gap varies with composition. This system is pseudo-binary because it comprises two compounds, lead telluride and tin telluride, together forming a solid solution. As shown in FIG. 1, the phase diagrams of lead telluride and tin telluride are respectively illustrated by curves 10 and 12 which peak at 917° C and 806° C. respectively. The point at which both respectively peak is at 50 mole or atom percent tellurium which indicates in both cases that the two compounds each comprise 50% tellurium. Between these two peak lines is the liquidus-solidus curve 16, 18 rather than a third peak. In a true compound, a third peak would occur between the first two peaks for lead telluride and tin telluride, the absence thereof being a verification of experimental work that lead tin telluride is a solid solution rather than a true ternary compound. For purposes of information and comparison, lead the tin are shown to have a phase diagram 14.

For convenience of description and clarity of the present invention, reference is further directed to FIG. 2 which represents that portion of the phase diagram of FIG. 1 which lies within the plane bounded by the 50 atom percent of tellurium and including the liquidus-solidus curve. As shown in FIG. 2, which shows the phase diagram for the lead tin telluride system in terms of temperature versus composition, it is seen that the system has a liquidus curve 16 above which lead tin telluride exists as a liquid solution and a solidus curve 18 below which lead tin telluride exists as a solid solution. In between the liquidus and solidus curves, lead tin telluride exists partly as a liquid solution and partly as a solid solution. One end of the phase diagram shows pure lead telluride having a melting point of approximately 917° C. At the other end of the phase diagram is shown pure tin telluride having a melting point at approximately 806° C. Between these two extremes, wherein the composition x indicates mole percent of tin telluride, the liquidus-solidus curve exhibits a narrow separation.

It is because of this separation between liquidus and solidus curves 16 and 18 that the above noted problems have existed in the prior art techniques. Specifically, for purposes of example, it is assumed that the liquid solution of lead tin telluride has a tin composition of approximately 30 mole percent and at a temperature of approximately 910° C. This position is indicated at point $x$. As the temperature of the solution is reduced to $T_1°$ C, the mole percent of tin remains the same until the liquidus curve is met at point $a$, showing 30 mole percent tin and 70 mole percent lead. However, the solid solution of lead tin telluride shows another composition at point $b$, having an approximate composition of 20 mole percent tin and 80 mole percent lead. As formation of the compounds continues through a decreasing temperature gradient to $T_2°$ C, the liquid solution moves from point $a$ to point $a'$, having a composition of approximately 41 mole percent tin and 59 mole percent lead. This temperature corresponds to a solid solution composition $b'$ of approximately 30 mole percent tin and 70 mole percent lead. As a consequence of the decreasing temperature gradient, the solid solution varies in composition from 20 mole percent tin to 30 mole percent tin. Thus, the composition is not uniform and, therefore, of low quality. The present invention overcomes this problem as well as others by obtaining crystal growth at a single temperature, as will hereinafter be described.

Figure 9:
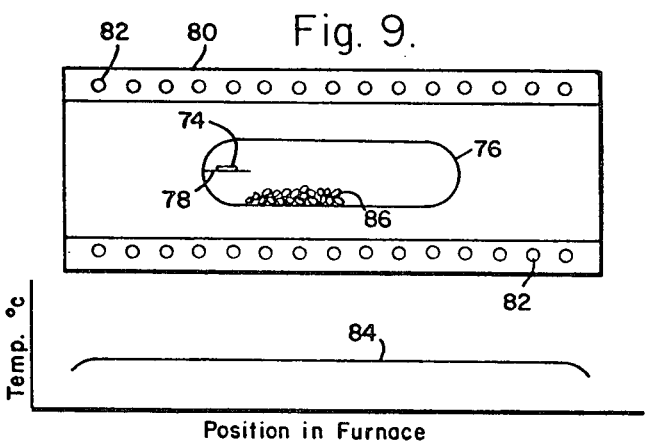
FIG. 9 is a schematic view of an annealing furnace and temperature curve for annealing the crystallization grown, melt grown and vapor grown crystals.
Figure 4:
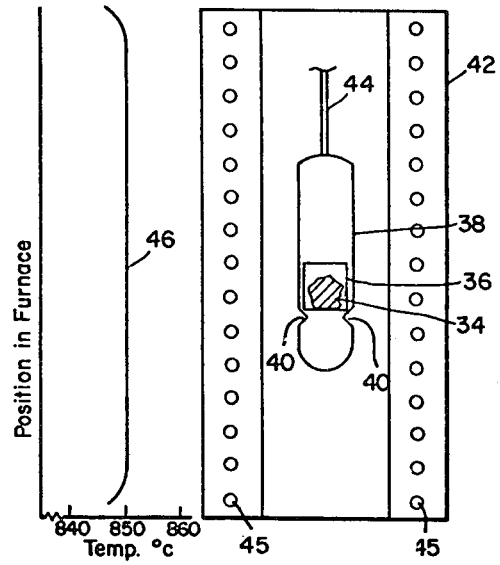
FIG. 4 schematically depicts the furnace and its temperature curve for recrystallization growth of single crystal lead tin telluride.

Specifically, the present invention is conducted particularly with respect to three steps illustrated with respect to the drawings of FIGS. 3, 4 and 9. Source material is prepared in the furnace depicted in FIG. 3, the single crystal is prepared by recrystallization in the furnace depicted in FIG. 4, and wafers of the crystal are annealed in the furnace shown in FIG. 9.

Accordingly, with reference to FIG. 3, specific amounts of lead, tin and tellurium of 99,999% purity are mixed and placed in an ampoule 20 of quartz or vitreous carbon. The ampoule is evacuated to approximately $10^{-6}$ Torr. and suspended within a furnace 22 by means of a rod 24. The furnace is sealed at ends 26 to prevent formation of convection currents. The furnace is heated by means of coil 28 or other suitable means to provide a temperature of approximately 950° C, as indicated by isothermal curve 30. If desired, the furnace temperature may be one or two degrees higher at its upper end than at its lower end to provide a slight but flat temperature gradient in order to prevent vapor transport in tube 20. The mixture 32 of lead, tin and tellurium with, if desired, an amount of bismuth suitable for doping, is held at this temperature for approximately four hours. The ampoule is then quenched to ambient temperature and the reactant material is broken into approximately one cubic centimeter pieces for use as a source material. A clean mortar and pestle is suitable for this purpose.

One such piece of lead tin telluride source material is indicated by numeral 34 of FIG. 4 which is placed within a quartz cup 36 open at its upper end. The quartz cup is positioned centrally within a growth tube 38 of quartz, and supported on indentations 40 formed on the tube. The tube is then evacuated to approximately $10^{-6}$ Torr. and sealed. It is preferred that cup 36 suspended within tube 38 in order to avoid temperature gradients during recrystallization of source material 34. Although it is possible to utilize a single tube 38, the use of this double tube insures that any possible cold spots on the outer tube will not affect the source material. Furthermore, if vapor transport should occur, the source material will not be contaminated thereby.

Evacuated and sealed tube with its contents are then placed within a furnace 42 and supported by a rod 44. Furnace 42 is provided with heating elements 45 or the like to provide an isothermal temperature profile 46. The temperature of the furnace is raised to approximately 860° C and maintained very uniform for a period of 5-14 days, during which time source material 34 is converted into a single crystal, such as that exemplified in FIG. 6.

The method described with respect to FIG. 4 is carried out in the liquid and solid two-phase region very close to the solidus field and in equilibrium with a constant vapor pressure.

Figure 5:
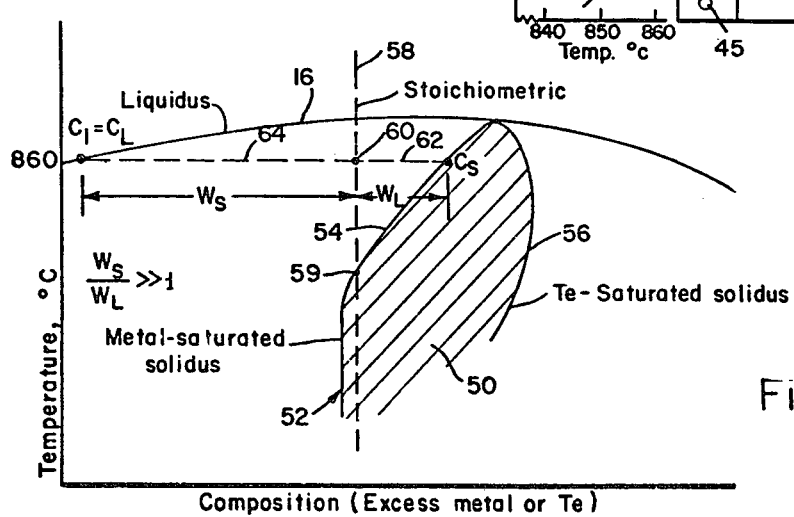
FIG. 5 depicts the expanded temperature-composition diagram for lead tin telluride taken along any vertical perpendicular of FIG. 2.

In order to further understand the physical changes which are being undergone during crystal growth, reference is directed to FIG. 5, which depicts that portion of the phase diagram of FIG. 1 and taken along any plane, such as plane 48, of FIG. 2. Thus, even though FIG. 2 does not show a solidus interface at 860° C at a tin composition of approximately 20 mole percent, solidus curve 18 does not extend perpendicular to the plane of FIG. 2 but has a slope as shown in FIG. 5. Therefore, the solidus portion of lead tin telluride is shown as the shaded portion indicated by indicium 50 encompassed within a solidus curve 52 having a metal saturated solidus curve portion 54 and a tellurium saturated solidus curve portion 56. Line 58 indicates stoichiometric composition of metal to tellurium and, at any point on this straight line and within the shaded portion 50, the resulting crystal is intrinsic. However, the present invention operates at temperatures which are higher than the highest intrinsic temperature point shown by indicium 59, that is, at the temperature referenced by indicium 60. This point 60 indicates that source material 34 being crystallized lies very slightly above solidus curve 54 (a portion of curve 18 of FIG. 2) and substantially below liquidus curve 16. Thus, the system physically has a very small liquid fraction $W_L$, as shown by line segment 62, and a large solid fraction $W_S$, as shown by line segment 64. The choice of the particular temperature of 860° C permits working of the present invention to obtain crystal growth within a reasonable period of time. It is possible to utilize a higher temperature; however, higher temperatures proportionately increase the metal vacancy concentration in the crystal. Such metal vacancy concentration produces undersirable electrical properties in the crystal. Also, higher temperatures increase the likelihood of increased leaching of impurities from the crucible.

During the 5-14 day growth period at 860° C, the crystal grows in accordance with the lever rule with the composition at $C_S$ on solidus curve 52. At the beginning of growth, the solid is in contact with a small amount of liquid, the diffusion medium where the mass transfer occurs, until the solid at $C_S$ is in equilibrium with the liquid at $C_I = C_L$, where S equals solid, I equals interface, and L equals liquid.

To understand the actual physical changes that occur in the growth of the single crystal, it is theorized that each solid grain of lead tin telluride has a small amount of liquid lead tin telluride about it and that the liquid coalesces or otherwise joins and moves to the bottom of cup 36 to permit the various grains to form by digestion.

Thus, it is believed that the liquid droplets coalesce and separate from the solid leaving the crystallites to undergo recrystallization. This liquid at the bottom of the crystal forms into an amorphous layer, as evidenced in crystal 66 of FIG. 6, comprising a single crystal 68 and an amorphous bottom 70.

The formation of a single crystal wherein larger grains digest smaller grains, is one theoretical explanation of growth of single crystals. Such an explanation has been presented by R. A. Laudise in "The Growth of Single Crystals", Chapter 4, Section 4.2, pages 114-127, (Prentice-Hall, Inc., Englewood Cliffs, N.J. 1970). This theory is briefly explained with respect to FIGS. 7a and 7b which illustrate a plurality of grains 72. The driving force for the solid-solid recrystallization of the present invention is the reduction of the extra energy stored in the boundary between grains 72. The coarsening of the grains at the expense of the smaller grains reduces the interfacial tension. The driving force ($\Delta G$) for recrystallization by strain annealing is given by $$\Delta G = w - q + G_s + \Delta G_o \qquad (1)$$

where $w$ is the work done either in deliberate straining or fabrication mostly residing at grain boundaries, $q$ is the energy released as heat, $G_s$ is a surface-free energy of the grains, and $\Delta G_o$ is the difference in free energy between the grain orientation existing in the specimen and the free energy of some other orientation. By decreasing grain-boundary area, a material decreases its excess free energy. A strained specimen is thermodynamically unstable with respect to an unstrained specimen. At room temperature the rate at which materials relieve strain is usually very slow. However, if the temperature is raised to increase the atomic mobility and the amplitude of lattice vibrations, the rate of strain relief is markedly increased. Thus, grain size increases, primary recrystallization takes place, and this process will be accelerated by an increase in temperature. Additional factors that are important in the ease of grain growth are the coherence of atoms across boundaries that are growing and the nature of the impurities present in the lattice and in the boundaries. Because atoms must move for grain growth to take place, growth will be easier (all other things being equal) across a boundary where the "register" on coherence of atoms is good so that only small movement is required.

In solid-solid growth, the large grain grows at the expense of the adjacent smaller grains.

Grain growth takes place by grain-boundary movement, not by the capture of very labile atoms or molecules, as in liquid-solid or gas-solid growth. The driving force is the reduction of the extra free energy stored in the grain boundary. Thus, grain-boundary movement acts to shorten boundaries. The boundary energy may be thought of as a sort of interfacial tension between the crystallites, and coarsening of the grains reduces this tension. The growth of a grain from many very small grains will be rapid, but the growth rate of a grain from a few only slightly smaller grains will be negligible. In growth of a large grain at the expense of small grains, as shown in FIG. 7a, if $\sigma_{S\text{-}S}$ is the interfacial tension between the small grains and $\sigma_{S\text{-}L}$ between the small grains and the large grain, then for growth.

$$\Delta A_{S\text{-}L} \sigma_{S\text{-}L} < \Delta A_{S\text{-}S} \sigma_{S\text{-}S} \qquad (2)$$

where $\Delta A_{S\text{-}S}$ is the change in area of the grain boundaries between small grains and $\Delta A_{S\text{-}L}$ is the change in area of the grain boundaries between the small grains and the large grain. If it is assumed that the grains are roughly circular and that the diameter of the large grain is D, then $$\Delta A_{S\text{-}S} = (\Delta D/2) n \qquad (3)$$

$$\Delta A_{S\text{-}L} = \pi \Delta D \qquad (4)$$

where $n$ is the number of small grains in contact with the large grain. Now, if $d$ is the small-grain average diameter, $$n \simeq \frac{\pi (D + \frac{d}{2})}{d} \simeq \frac{D}{d} \qquad (5)$$

because the numerator is the circumference of the circle that is the locus of the centers of the small grains, and because $D > d$. Substituting the appropriate quantities in Eq. (2), $$D > \frac{2\sigma_{S\text{-}L} d}{\sigma_{S\text{-}S}} \qquad (6)$$

for growth to take place.

The foregoing assumes no directional dependence of the interfacial energies. Grain boundaries will have $\sigma$'s depending in detail on the orientation of the grains that they delineate and on the orientation of the boundary relative to the grains. Boundaries may be large-angle or small-angle and they may involve a twist or a tilt between the grains. In the growth of large crystals, of interest is boundary mobility whose rate, R, is given by the relation $$R \propto (\sigma/R)M \qquad (7)$$

where $R$ is the radius of curvature of the boundary, $\sigma$ is the interfacial energy, and $M$ is the mobility. The boundary area is decreased when movement is toward the direction of the radius of curvature, as shown in FIG. 7b. Depending on the boundary and grain geometry, boundary motion may involve slip or glide or may require dislocation movement. If individual atoms must move, the process will be slow unless the temperature is an appreciable fraction of the melting point.

Secondary recrystallization is favored under conditions where there is a fine-grained strong texture containing a few larger crystals with slightly different orientation. If a material has pronounced texture, most of the crystals are preferentially oriented. Thus the driving force for the recrystallization is furnished by the removal of strain, by the size difference, and by the orientation difference of the crystals that grow, because, in Eq. (1), $w$, $G_s$, and $\Delta G_o$ are all large. In particular, even after primary recrystallization has taken place, G, $G_s$ and and $\Delta G_o$ will still be large enough to provide a substantial driving force. Pronounced texture will assure that only a few crystals will have the orientational driving force.

Thus, the formation of many grains eventuates into a single crystal.

Figure 8A:
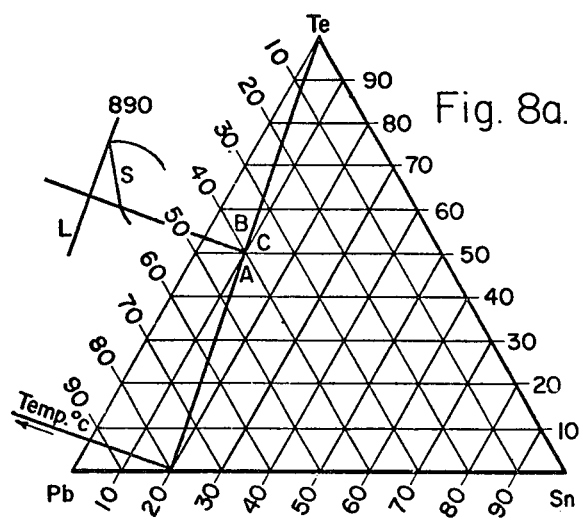
FIG. 8a 8b are respectively a ternary diagram for lead tin telluride and an expanded section of the ternary phase diagram.
Figure 8B:
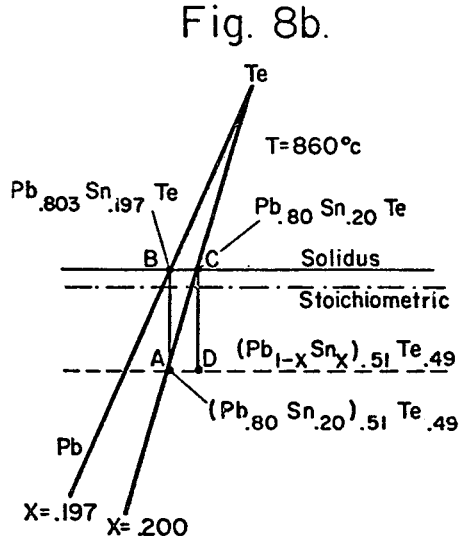

When the composition of the lead tin telluride source is intended not to be stoichiometric, the relationship of liquid and solid fractions, as shown in FIG. 5, change in such a manner that $(W_S/W_L)$ stoichiometric > $(W_S/W_L)_{metal\text{-}rich}$ because point 60 has been moved slightly toward the left, as viewed in FIG. 5. A similar result occurs as with a stoichiometric source, except that the crystal shows a higher ratio of lead to tin. This variation in composition and stoichiometry may be understood with reference to FIGS. 8a and 8b, the former figure showing a greatly enlarged portion of the FIG. 5 diagram moving out perpendicular to the illustration. As shown, FIG. 8b is an enlarged portion of FIG. 8a at points A, B and C. The starting material is assumed to have a composition, expressed as $(Pb_{0.80}Sn_{0.20})_{0.51}Te_{0.49}$, which occupies a position A in the ternary phase diagram. At equilibrium, the solid has a composition indicated at point B, expressed as $Pb_{0.803}Sn_{0.197}Te$, which is a point on the solidus nearest point A. It also indicates that the crystal has a p-type conduction unless it is doped with a donor purity, in which case the $p=n$ boundary is shifted. In order to arrive at the desired composition, e.g., $Pb_{0.80}Sn_{0.20}Te$, it is necessary to start with a composition at point D. This analysis only indicates the direction in which the lead/tin ratio shifts.

Figure 6:
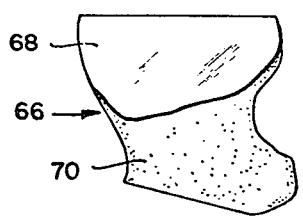
FIG. 6 is a drawing of a cross-section of an actual crystal grown by the present invention.

As stated above, the result of this growth is a crystal which has the appearance in cross-section of that depicted in FIG. 6, which is taken from a photograph of an actual crystal which had been grown. This crystal showed a uniform composition, resulting from the constant growth temperature. As compared to the Czochralski and Bridgman methods, this crystal grown by the method of the present invention showed a corresponding reduction in the concentration of defects and additionally exhibited reduced impurity pickup from the growth cup since, at the initial stage of the growth, the source in the cup was formed into a hemispherical shape by the surface tension of the liquid surrounding the crystallites and since only the bottom was in contact with the cup. Further, mechanical stress consequent to the direct contact of the crystal with the walls of the cup was reduced and constitutional supercooling was absent since the growth was under near-equilibrium conditions.

The crystal was then annealed in order to reduce the as-grown high carrier concentration. Such annealing was accomplished either by use of a prior art method or by use of still another aspect of the present invention.

One prior art method is described in "Single Crystal Lead-Tin Chalcogenides" by I. Melngailis and T. C. Harman, Lincoln Laboratory, Massachusetts Institute of Technology, Lexington, Mass. (contained in pl. V of "Semiconductors and Semimetals", ed. R. K. Willardson and A. C. Beer Academic Press, Inc., 1970). This method incorporates isothermal metal saturated annealing. The undoped as-grown crystal is sliced into thin wafers and the wafers are isothermally annealed with a metal-rich powder, since, as above shown with respect to FIG. 5, the crystal formed at point $C_s$ which is within the region of excess tellurium. By including excess lead and tin, vacancies produced by excess tellurium are filled so as to establish stoichiometry in the crystal. This annealing took place for approximately two months due to the slow diffusion rate arising from the low crossover temperature, that is, the temperature at which the stoichiometric line crosses the solidus line. Thus lead and tin are diffused into the crystal.

The annealing method comprising a further aspect of the present invention substantially reduces this two months time to a period of approximately 5 days, by annealing the as-grown high hole concentration crystal to low hole concentration. Conversion to low electron concentration and high mobility may be also obtained. This technique requires that the as-grown crystal be doped with bismuth and then synthesized by the present invention or by a prior art vapor growth, Bridgman, or Czochralski technique.

Regardless of the use of the specific crystal growth method employed, the starting materials were doped with $9 \times 10^{18}$ Bi/cm$^3$ of lead in telluride. After growth according to the above method, the crystal, such as that shown in FIG. 7, was cut parallel to the (100) facet to produce a wafer of approximately 30 mils thick.

The wafers were then chemically etched in a solution of 10% bromine in hydrogen bromide at room temperature for a time sufficient, such as a minute or so, to remove the damage from the wafer cutting operation. The annealing then took place in the apparatus depicted in FIG. 9 in which a wafer 74, such as that described above, was placed within a fused silica ampoule 76 on a support 78. In the lower part of ampoule 76 was placed a metal-rich powder 86, e.g., 10 milligrams, which is sufficient to maintain a metal-rich vapor pressure within the ampoule. Although lead and tin alone could be utilized for the annealing process, it was preferred to use a lead tin telluride composition of $(Pb_{1-x}Sn_x)_{0.51}Te_{0.49}$, where $x$ is the mole fraction of tin and approximately equal to that of tin in the crystal. The ampoule is then evacuated and backfilled with argon or other inert gas and then sealed. The sealed ampoule is then placed within a furnace 80 whose heating coils 82 heated the furnace to provide a very flat isothermal temperature curve 84. The temperature was raised to between 600° C to 660° C, the specific temperature depending upon the mole fraction of tin in the crystal. Annealing continued for approximately 5 days and the crystal and contents were then quenched to ambient temperature in air.

As stated above, the temperature at which annealing takes place depends upon the mole fraction of tin of the crystal. Specifically, with reference to FIG. 5, the addition of a Group VA element, such as bismuth, antimony and arsenic, moves stoichiometric line 58 to the right, thus moving point 59, where the stoichiometric line crosses the solidus curve to a higher temperature. Furthermore, the amount of tin in the crystal also changes the lead tin telluride solidus curve to the left or right, thus also affecting the particular intersection point 59 between stoichiometric curve 58 and solidus curve 52. Therefore, the precise temperature used for annealing depends upon the location of point 59.

The resulting crystal was of p-type; however, by lowering the temperature to a value between 200° and 600° C for approximately two hours and then quenched, the crystal becomes n-type.

This conversion from p-type to n-type occurs whether or not the wafer was left in the quenched ampoule with the metal-rich lead tin telluride powder or transferred to a clean ampoule without the metal-rich powder and then placed in the furnace at 200° C for the two hours.

Figure 10:
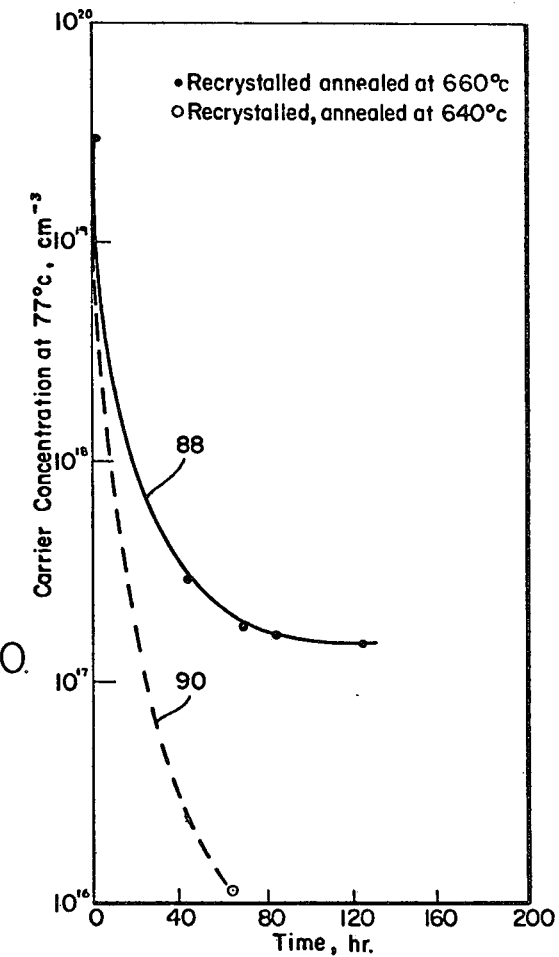
FIG. 10 is a graph showing results of isothermal annealing of the crystallized samples obtained by use of the present invention.

The results of annealing at 640° C and 660° C are shown in FIG. 10. For the annealing at 660° C as evidenced by curve 88, the carrier concentration leveled off at between $1 \times 10^{17}$ cm$^{-3}$ and $2 \times 10^{17}$ cm$^{-3}$ for the vapor-grown and recrystallized samples grown from a metal-rich source doped with $8-9 \times 10^{18}$ cm$^{-3}$ Bi. For the annealing at 640° C, as shown by curve 90, both p-type and n-type wafers were obtained. The transition temperature from $p$ to $n$ appears to be approximately 640° C for the annealing in the presence of the metal-rich source for crystals having the composition of $Pb_{0.82}Sn_{0.18}Te$. The annealing below 610° C yielded n-type for crystals having the same composition.

Several crystals grown by the above method resulted in crystals of excellent quality. The several crystals grown are shown by specific examples given in the Tables below, wherein TABLE I shows preparation of source material, TABLE II shows crystals grown from the TABLE I source materials, TABLE III shows annealing of the TABLE II recrystallized crystals, and TABLE IV shows how some of the crystals annealed at 200° C were converted from p-type to n-type.

TABLE I
PREPARATION OF SOURCE MATERIAL

| Crystal No. | Pb gms | Sn gms | Te gms | Bi gms | Reaction Temp. ° C | Reaction Tire-Hrs. | Composition |
|---|---|---|---|---|---|---|---|
| 1,2 | 52.08 | 7.47 | 38.51 | 0.0385 | 950 | 4 | $(Pb_{0.80}Sn_{0.20})_{0.51}Te_{0.49}$ |
| 3 | 55.27 | 7.92 | 42.54 | 0.0429 | 950 | 1 | $Pb_{0.80}Sn_{0.20}Te$ |
| 4 | 52.49 | 9.50 | 42.53 | 0.042 | 950 | 4 | $Pb_{0.76}Sn_{0.24}Te$ |

TABLE II
RECRYSTALLIZATION

| Crystal No. | Growth Temp. ° C | Growth Time. Days | Composition | Type | Carrier Concentration* Hall No.$P_H cm^{-3}$ | Motility* $\mu_H$ $cm^2/v. sec.$ |
|---|---|---|---|---|---|---|
| 1 | 853 | 9 | $Pb_{0.82\pm0.0048}Sn_{18.0\pm0.0021}Te$ | P | $2.8 \times 10^{19}$ | 1300 |
| 2 | 860 | 12 | $Pb_{0.82\pm0.0024}Sn_{17.0\pm0.0013}Te$ | P | $3.0 \times 10^{19}$ | 1200 |
| 3 | 854 | 14 | $Pb_{0.796\pm0.0013}Sn_{0.204\pm0.0066}Te$ | P | $2.8 \times 10^{19}$ | 1600 |
| 4 | 853 | 14 | $Pb_{0.759\pm0.0086}Sn_{0.241\pm0.0068}Te$ | P | $2.8 \times 10^{19}$ | 1200 |

*at 77° K

TABLE III
ANNEAL (First)

| Crystal No. | Powder | Anneal Temp. ° C | Anneal Temp., Hrs. | Type | Carrier Concentration* Hall No. $P_H$ or $P_H$ $cm^{-3}$ | Mobility* $\mu_H$ $cm^2/v. sec.$ |
|---|---|---|---|---|---|---|
| 1 | $(Pb_{0.80}Sn_{0.20})_{0.51}Te_{0.49}$ | 660 | 120 | P | $1.8 \times 10^{17}$ | 30,000 |
| 2 | " | 660 | 120 | P | $1.6 \times 10^{17}$ | 21,000 |
| 3 | " | 660 | 120 | n | $1.1 \times 10^{17}$ | 50,000 |
| 4 | " | 664 | 67 | P | $4.5 \times 10^{17}$ | 24,000 |

*at 77° K

TABLE IV
ANNEAL (Second)

| Crystal No. | Anneal Temp. ° C | Anneal Temp., Hrs. | Type | Carrier Concentration* Hall No., $cm^{-3}$ | Mobility*, $\mu_H$ $cm^2/v. sec.$ |
|---|---|---|---|---|---|
| 1(a)** | 400 | 2 | n | $n_H = 5 \times 10^{17}$ | 41,000 |
| 1(b)** | 200 | 2 | n | $n_H = 1.8 \times 10^{17}$ | 45,000 |
| 1 | 643 | 96 | p | $P_H = 3.7 \times 10^{17}$ | 26,000 |

*at 77° K
Wafers transferred to clean ampoule without metal-rich powder.
**Two wafers were prepared from crystal no. 1. Crystals 2 and 3 were not further annealed.

Although the invention has been described with reference to particular embodiments thereof, it should be realized that various changes and modifications may be made therein without departing from the spirit and scope of the invention.

What is claimed is:

1. A method for synthesizing at least a one cubic centimeter single crystal of lead tin telluride having the approximate composition of 40 mole percent lead, 10 mole percent tin, and 50 mole percent tellurium comprising the steps of:
   reacting charge materials of lead, tin and tellurium at a temperature of approximately 950° C for approximately 4 hours in an enviroment evacuated to approximately $10^{-6}$ Torr to form a source material;
   heating a quantity of the source material sufficient to form the single crystal at an isothermal temperature of approximately 850° C for a time span of approximately five to fourteen days in an enviroment evacuated to approximately $10^{-6}$ Torr to form the single crystal with an as-grown carrier concentration arising as a consequence of having vacancies in which metal vacancies predominate; cutting the single crystal into wafers; and
   annealing wafers of the single crystal by heating the wafers for about 5 days at a temperature within the range of about 600° C to 660° C in a closed environment having a solid metal-rich source of lead, tin and tellurium vapors and having the composition of $(Pb_{1-x}Sn_x)_{0.51}Te_{0.49}$ wherein x is the mole fraction of tin approximately equalling the mole fraction of tin in the single crystal said source being in an atmosphere of inert gas at a pressure of one-third atmosphere, sufficient to establish and maintain an equilibrium vapor pressure over the wafers, corresponding to the annealing temperature, for a period of time sufficient to reduce the as-grown carrier concentration of the crystal.

2. A method as in claim 1 wherein the charge material further includes $9 \times 10^{18}$ atoms bismuth per cubic centimeter.

3. A method as in claim 2 further including the post annealing step of further annealing the wafer at a temperature of approximately 200° C to produce an n-type crystal.

4. A method for synthesizing single crystal lead tin telluride material comprising the steps of:
   heating a charge comprising a substantially uniform pseudo-binary lead tin telluride having the composition of 40 mole percent lead, 10 mole percent tin and 50 mole percent tellurium doped with bismuth in an isothermal environment evacuated to approximately $10^{-6}$ Torr a resulting sufficiently high uniform temperature of approximately 950° C for forming a solid and liquid phase of the composition existing in the solid plus liquid region of the temperature-composition phase diagram in which the quantity of the solid phase is greater than the quantity of the liquid phase;

maintaining the charge in the evacuated and isothermal environment and at the resulting sufficiently high uniform temperature for a time span of 5 to 14 days sufficient for equilibrating the solid phase portion of the charge with the liquid phase portion of the charge in accordance with the lever rule, for thereby serving as a vehicle for diffusion and crystal growth by digestion and thereby for forming the single crystal material having an inherent carrier concentration arising as a consequence of having vacancies in which metal vacancies predominate; cutting the single crystal formed into wafers; and reducing the inherent carrier concentration of the wafers by annealing by heating the wafers with a metal-rich powder having the composition $(Pb_{1-x}Sn_x)_{1-y}Te_y$, wherein $0 \leq x \leq 1$ and $y < 0.5$, $x$ being the mole fraction of tin approximately equalling the mole fraction of tin in the single crystal material and $y$ being the mole fraction of tellurium, in an inert atmosphere of vapor from said metal rich powder and an inert gas at a pressure of one-third atmosphere, and at a temperature of about 600° to 660° C which above the temperature at which the solidus curve intersects the stoichiometric line and below the growth temperature of the crystal for providing a reduced carrier concentration less than the inherent carrier concentration.

5. A method as in claim 4 further including the post-heating and pre-annealing step of etching the cut wafers in a solution of 10% bromine in hydrogen bromide.

6. A method as in claim 4 further including the post-annealing step of further annealing the portion of the single crystal material at a temperature of 200° C to 600° C for imparting n-type conductivity to the annealed portion.

7. A method for synthesizing at least a one cubic centimeter single crystal of lead tin telluride comprising the steps of: reacting charge materials having the approximate composition of 40 mole percent lead, 10 mole percent tin, and 50 mole percent tellurium in an environment evacuated to approximately $10^{-6}$ Torr at a temperature of about 950° C and for a time of about 4 hours sufficient for forming a melt therefrom and thereafter for forming a polycrystalline source material from the melt of the charge materials;

heating a quantity of the source material at an isothermal temperature of about 850° C commensurate with the proportions of the charge materials and for a time span of approximately five to fourteen days in an environment evacuated to approximately $10^{-6}$ Torr for forming the single crystal and for imparting the single crystal with an as-grown carrier concentration arising as a consequence of having vacancies in which metal vacancies in which metal vacancies predominate; cutting said single crystal into wafers; and annealing wafers of the single crystal at a temperature within the range of about 600° C to 660° C in a closed environment having a solid metal-rich source of lead, tin and tellurium vapors, said source having the composition $(Pb_{1-x}Sn_x)_{1-y}Te_y$, wherein $0 \leq x \leq 1$ and $y < 0.5$, $x$ being the mole fraction of tin approximately equalling the mole fraction of tin in the single crystal material and $y$ being the mole fraction of tellurium, sufficient for establishing and maintaining an equilibrium vapor pressure over the wafers in an inert atmosphere having an inert gas pressure of one-third atmosphere, corresponding to the annealing temperature, for a period of time of about 5 days sufficient for reducing the as-grown carrier concentration of the crystal.

8. A method as in claim 7 wherein the charge material further includes approximately $9 \times 10^{18}$ atoms bismuth per cubic centimeter.

9. A method as in claim 8 further including the post-annealing step of further annealing the wafer at a temperature of approximately 200° C for producing an n-type crystal.

* * * * *